United States Patent
Hurwitt et al.

[11] Patent Number: 5,795,448
[45] Date of Patent: Aug. 18, 1998

[54] MAGNETIC DEVICE FOR ROTATING A SUBSTRATE

[75] Inventors: Steven Hurwitt, Park Ridge, N.J.; Ira Reiss, New City, N.Y.; Marian Zielinski, Washington Township, N.J.; Swie-In Tan, San Jose, Calif.

[73] Assignees: Sony Corporation, Tokyo, Japan; Materials Research Corp., Orangeburg, N.Y.; Read Rite Corp., Milpitas, Calif.

[21] Appl. No.: 570,220

[22] Filed: Dec. 8, 1995

[51] Int. Cl.$^6$ .............................. C23C 14/34; C23C 14/50
[52] U.S. Cl. .................... 204/192.1; 204/192.12; 204/298.06; 204/298.08; 204/298.15; 204/298.23; 204/298.27; 204/298.28; 118/729; 118/730
[58] Field of Search .................. 204/192.1, 192.12, 204/298.08, 298.15, 298.23, 298.27, 298.28, 298.06; 118/729, 730, 500; 198/377, 381, 414, 472.1, 478.1

[56] References Cited

U.S. PATENT DOCUMENTS

| | | | |
|---|---|---|---|
| 4,793,911 | 12/1988 | Kemmerer et al. | 204/298.27 |
| 5,106,346 | 4/1992 | Locher et al. | 118/730 |
| 5,124,013 | 6/1992 | Seddon et al. | 204/298.27 |
| 5,377,816 | 1/1995 | Deligi et al. | 198/619 |
| 5,468,299 | 11/1995 | Tsai | 118/730 |
| 5,525,199 | 6/1996 | Scobey | 204/298.27 |

*Primary Examiner*—R. Bruce Breneman
*Assistant Examiner*—Rodney G. McDonald
*Attorney, Agent, or Firm*—Pasquale Musacchio; Jerry A. Miller

[57] ABSTRACT

A device for rotating a substrate in a complex motion within a chamber which during a sputtering process. The device includes a first support element positioned within the chamber. The first support element includes a first rotating structure which is affixed between a platform for supporting the substrate and a first magnet positioned adjacent to the inner wall surface. Further, the first rotating structure is adapted to rotate about a first axis. The device further includes a second support element positioned outside of the chamber. The second support element includes a second rotating structure affixed between a planet gear adapted for engagement with a sun gear outside of the chamber and a second magnet positioned adjacent the outer wall surface and spaced apart from the first magnet. This causes the formation of a magnetic bond between the first and second magnets. Further, the second rotating structure is adapted to rotate about the first axis thereby enabling the first and second rotating structures to rotate in unison about the first axis. In addition, the device includes a drive element affixed to the first and second support elements, wherein rotation of the drive element causes a first rotation of the first and second rotating elements and thus the substrate about a center axis. This also causes a second rotation wherein the engagement of the sun gear and the planet gear causes simultaneous rotation of the substrate about the first axis.

30 Claims, 4 Drawing Sheets

1

MAGNETIC DEVICE FOR ROTATING A SUBSTRATE

FIELD OF THE INVENTION

The present invention relates to devices for rotating a substrate during a sputtering process, and more particularly, to a device having magnetic elements for magnetically coupling spaced apart elements of the device to enable the substrate to be rotated during the sputtering process.

BACKGROUND OF THE INVENTION

A sputtering process is typically used in the manufacture of an integrated circuit. In this process, a thin layer, or film, of metal is formed on a substrate such as a semiconductor wafer. A sputtering system is used to form the film. The sputtering system includes a vacuum chamber having a cathode which includes a source target. During the sputtering process, material is removed from the source target and subsequently deposited on the substrate to form the film.

It is desirable that the film formed on the substrate have a highly uniform thickness. By way of example, for semiconductor wafers, it is desirable that the film have a thickness uniformity not exceeding a range of ±5% relative to the thickest and thinnest areas of the film. Thickness uniformity in this range may be achieved by suitable design of the cathode. For other types of products, such as heads for magnetic data storage and retrieval, a higher level of thickness uniformity not exceeding a range of ±2% or higher is desirable. It has been found that thickness uniformity in this range is not readily achieved by cathode design alone. As such, other uniformity enhancing techniques are utilized.

One such uniformity enhancing technique includes moving the substrate in a predetermined motion relative to the source target as the substrate is being sputtered. Several types of motion are utilized. One type of motion that is commonly used provides a linear traverse of the substrate past the cathode. Another type of motion provides rotation of the substrate relative to the cathode. A further type of motion provides both an arc shaped movement in conjunction with simultaneous rotation of the substrate, thus forming a compound pattern of movement.

Typically, a planetary drive mechanism is used to generate the compound pattern. Referring to FIG. 1, a conventional planetary drive mechanism 10 used in conjunction with a sputtering system 12 is shown. The drive mechanism 10 includes a drive shaft 14 and a drive motor 16 for rotating the drive shaft 14 about a center axis 18. The system 12 includes a chamber 20 having an interior cavity 24 and a pumping port 22. The chamber 20 further includes at least one cathode 26 for forming a thin film on a substrate. The drive shaft 14 extends upwardly into the cavity 24 through a feedthrough element 28 affixed to the chamber 20. In use, the cavity 24 is evacuated through the pumping port 22 by a vacuum pump or other suitable device (not shown) to a vacuum level which is suitable for sputtering. The feedthrough element 28 serves to seal the drive shaft 14 and chamber 20 so as to substantially maintain the vacuum level within the chamber.

The drive mechanism 10 further includes a sun gear 30 having a central bore 32. The sun gear 30 is affixed to the chamber 20 within the cavity 24 and is thus stationary. The drive shaft 14 extends through the central bore 32 and extends above the sun gear 30. A plurality of arm elements 34 extend radially outward from the drive shaft 14, thus forming a spoke type arrangement. Each of the arm elements 34 include a bearing housing 36 having a platform shaft 38.

2

Each platform shaft 38 is affixed between a platform 40 for supporting a substrate 42 and a planet gear 44 which engages the sun gear 30. It is noted that the gear teeth for each planet gear 44 and the sun gear 30 are not shown for purposes of clarity. Each bearing housing 36 is adapted to enable rotation of the associated platform shaft 38, planet gear 44, platform 40 and substrate 42 rotates about an associated platform axis 46.

In operation, the drive motor 16 is activated to cause rotation of the drive shaft 14. Rotation of the drive shaft 14 causes a corresponding circular rotation of each of the arm elements 34, each bearing housing 36, platform shaft 38, platform 40 and substrate 42 about the center axis 18. This circular rotation, in conjunction with the engagement between each planet gear 44 and sun gear 30, also causes a simultaneous rotation of each planet gear 44 and associated platform shaft 38, platform 40 and thus each substrate 42 about its associated platform axis 46.

During the sputtering process, a deposition zone 49 for forming a thin film on each substrate 42 is generated adjacent to the cathode 26 within the cavity 24. The cathode 26 is typically positioned within the chamber 20 such that each substrate 42 travels in an arc shaped movement through the deposition zone 49 due to the circular rotation of each substrate 42 about the center axis 18. This arc shaped movement, in conjunction with the simultaneous rotation of each substrate 42 about its associated platform axis 46, results in a compound pattern of movement for the substrate 42 when in the deposition zone 49. Such compound patterns have been found to be highly effective for improving film uniformity.

However, such drive mechanisms have disadvantages. One disadvantage is that the sun gear 30 and each planet gear 44 become worn due to contact, notwithstanding the use of lubricants. Such wear results in the formation of large amounts of metal particulates, some as small as 0.2 microns, within the cavity 24. During the course of the sputtering process, many of these particulates become embedded in the film which is formed on a substrate. This frequently causes failures in devices which include the film. By way of example, it is desirable that the particle density for the film be less than 0.1 particles per cm$^2$ of substrate surface. However, it has been found that drive mechanisms which utilize gears frequently generate a particle density of 100 or more particles per cm$^2$ of substrate surface, thus substantially exceeding the desired particle density.

Further, each planet gear 44 and the sun gear 30 are sized to provide a predetermined gear ratio. Thus, if the sun gear 30 includes 500 teeth and each planet gear 44 includes 50 teeth, each substrate 42 will rotate ten times about its associated platform axis 46 for each rotation of the substrate 42 about the center axis 18. As such, the ratio of rotational speed for each substrate 42 about its associated platform axis 46, relative to that about the center axis 18, is fixed. It is frequently desirable to compensate for selected film non-uniformities by varying the ratio of rotational speed. However, replacement of each planet gear 44 and the sun gear 30 in such systems is laborious and time consuming. This increases costs and is a further disadvantage.

Therefore, it is an object of the present invention to provide a device for moving a substrate wherein the device generates a minimal amount of particulates during sputtering on substrates.

It is a further object to provide a device for moving a substrate wherein the rotational speed for substrates about the associated platform axis, relative to that about the center axis, may be readily varied and inexpensively achieved.

It is a still further object of the present invention to provide a device for moving a substrate which provides an electrical bias on each substrate as each substrate is moved in the predetermined pattern.

SUMMARY OF THE INVENTION

A device for rotating a substrate within a chamber for a sputtering process having an outer wall surface and an inner wall surface for defining a cavity. In particular, the device includes a first support element positioned within the cavity. The first support element includes a first rotating structure which is affixed between a platform for supporting the substrate and a first magnet positioned adjacent to the inner wall surface. Further, the first rotating structure is adapted to rotate about a first axis.

The device further includes a second support element positioned outside of the chamber. The second support element includes a second rotating structure affixed between a planet gear adapted for engagement with a sun gear and a second magnet positioned adjacent the outer wall surface and spaced apart from the first magnet. This causes the formation of a magnetic bond between the first and second magnets. Further, the second rotating structure is adapted to rotate about the first axis thereby enabling the first and second rotating structures to rotate in unison about the first axis.

In addition, the device includes a drive element affixed to the first and second support elements, wherein rotation of the drive element causes a first rotation of the first and second rotating elements and thus the substrate about a center axis. This also causes a second rotation wherein the engagement of the sun gear and the planet gear causes simultaneous rotation of the substrate about the first axis. Further, the first and second rotations may be generated by either common or independent motor elements.

DETAILED DESCRIPTION OF THE INVENTION

Figure 1:
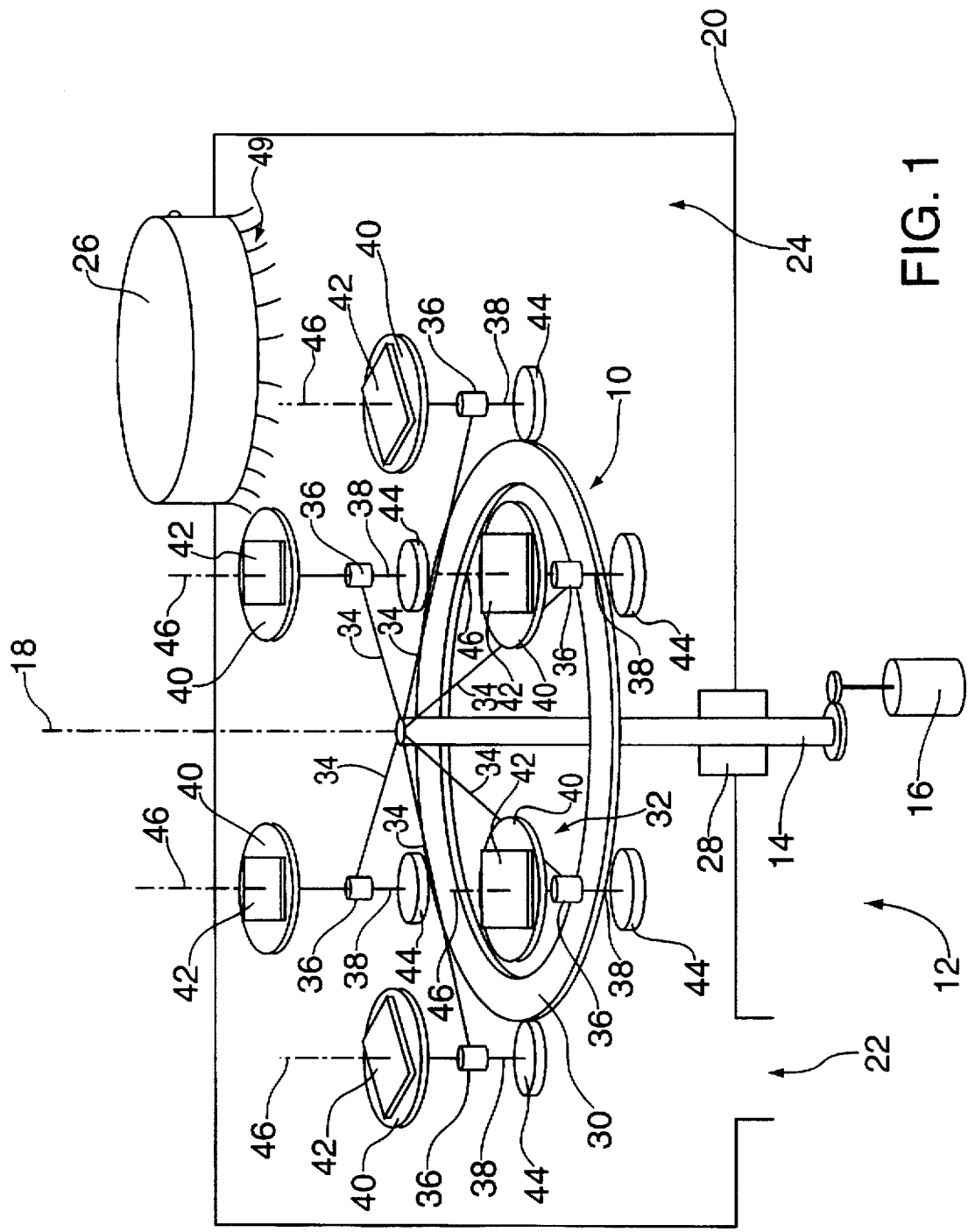
FIG. 1 is a view of a conventional planetary drive mechanism.
Figure 3A:
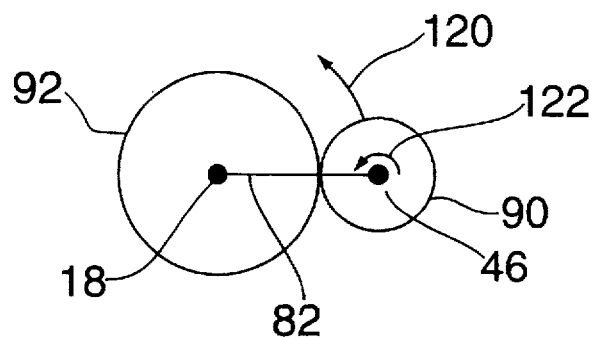
FIGS. 3A–3B are views depicting relative motion of an exemplary sun gear, arm element and plane gear in accordance with the present invention.
Figure 3B:
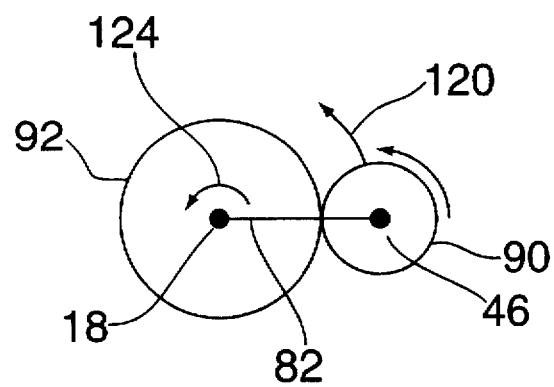
Figure 4:
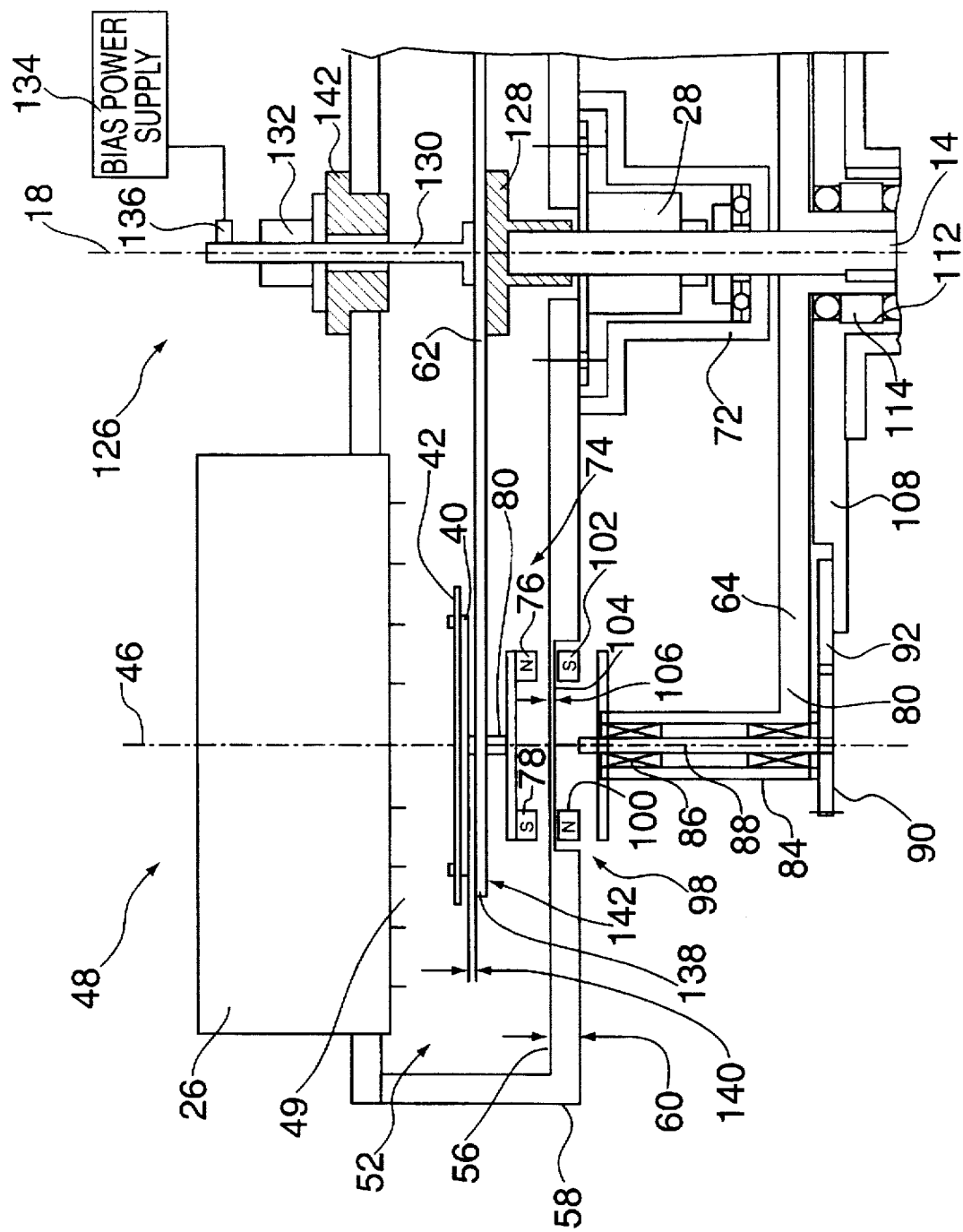
FIG. 4 is a view of an alternate embodiment for the device of the present invention.

The present invention will now be described by referring to FIGS. 2–4, wherein like elements are designated by like reference numerals. It is further noted that in the following description, reference will also be made to like elements from FIG. 1.

Figure 2:
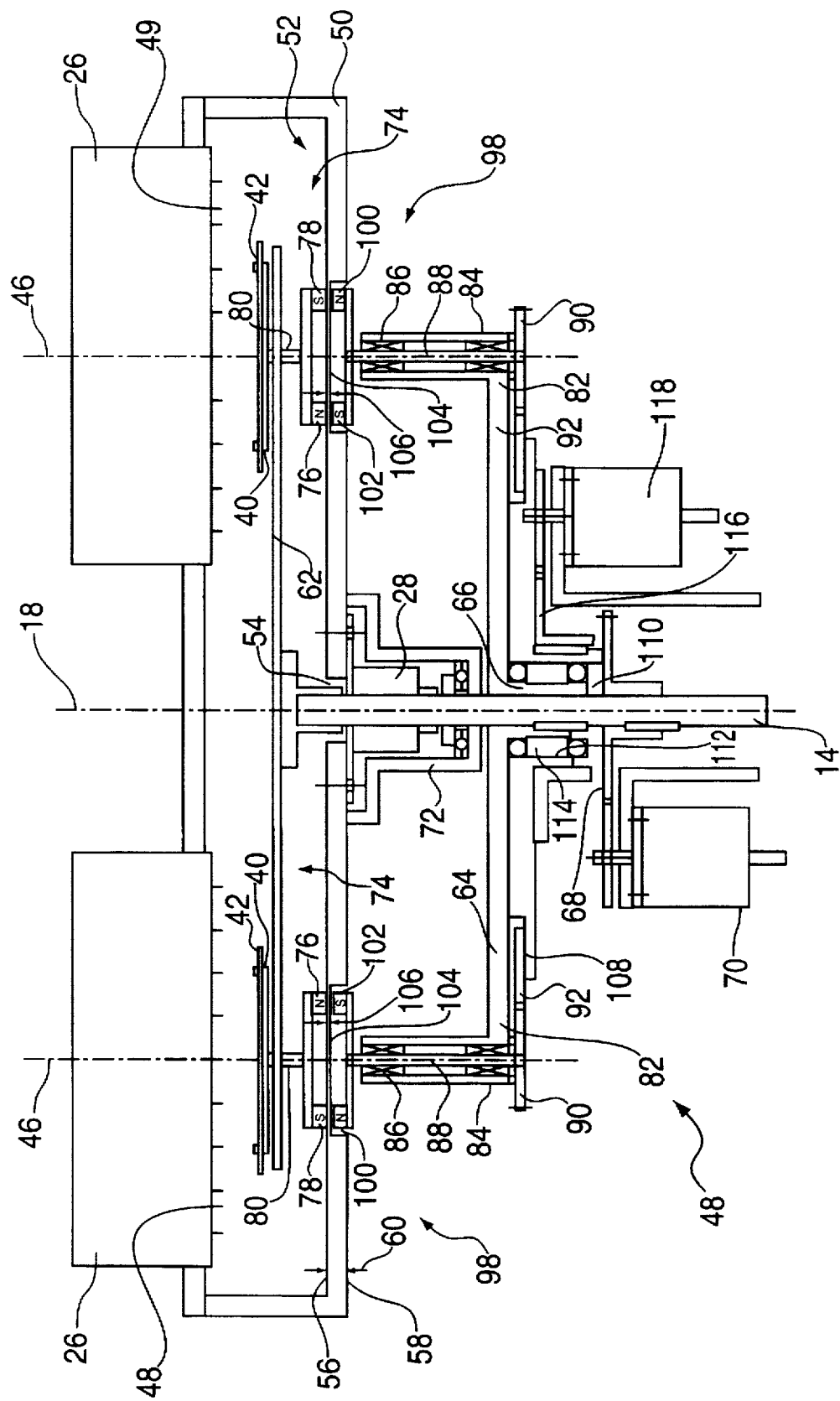
FIG. 2 is a cross sectional view of a device for rotating a substrate in accordance with the present invention.

Referring to FIG. 2, a cross sectional view of a device 48 for rotating substrates is shown. The device 48 includes a deposition chamber 50 in accordance with the present invention having an inner wall surface 56 for defining a chamber cavity 52 and an outer wall surface 58. The inner 56 and outer 58 wall surfaces are separated by a first wall thickness 60. The chamber 50 includes an aperture 54 which extends through the first wall thickness 60. In addition, the chamber 50 is connected to a vacuum pump or other device (not shown) for evacuating the cavity 52 to a vacuum level suitable for performing a sputtering process. An upper spider structure 62 for supporting a plurality of substrates is positioned within the cavity 52. In addition, a lower spider structure 64 having a downwardly extending neck section 66 is positioned outside of the chamber 50. The drive shaft 14 is affixed to the upper spider structure 62 and extends through the aperture 54 and neck section 66 and is affixed to the neck section 66. The device 48 further includes a first gear set 68 and a first motor 70 which are adapted to rotate the drive shaft 14 and thus the upper 62 and lower 64 spider structures about the center axis 18. A seal housing 72 which includes the feedthrough element 28 is positioned over the aperture 54 and is affixed to the outer wall surface 58. The seal housing 72 and feedthrough element 28 serve to seal the drive shaft 14 and chamber 50 so as to maintain a vacuum level within the chamber 50 which is suitable for sputtering.

Each platform 40 is associated with a driven magnetic structure 74 positioned within the cavity 52. In FIG. 2, only two driven magnetic structures are shown for purposes of illustration. Each driven magnetic structure 74 includes driven north 76 and south 78 magnetic poles positioned adjacent to the inner wall surface 56. An upper platform shaft 80 is affixed between each platform 40 and associated driven magnetic structure 74. Each upper shaft 80 extends through the upper spider structure 62 and is rotatably mounted within the upper spider structure 62. This enables rotation of each platform 40, associated driven magnetic structure 74 and each substrate 42 about its associated platform axis 46.

The lower spider structure 64 includes an arm element 82 associated with each platform 40. Each arm element 82 includes an upstanding spider housing 84 having a bearing element 86 and a lower platform shaft 88. Each lower shaft 88 is affixed between an associated planet gear 90 for engaging the sun gear 92 and a driver magnetic structure 98. Each bearing element 86 is adapted to enable rotation of the lower shaft 88, thus enabling rotation of the associated planet gear 90 and driver magnetic structure 98. The driver magnetic structure 98 includes driver north 100 and south 102 magnetic poles which are positioned adjacent to the outer wall surface 58 and opposite the driven south 78 and north 76 poles, respectively. This forms a magnetic coupling between the driver 98 and driven 74 magnetic structures which enables the transmission of torque between driver 98 and driven magnetic 74 structures. As such, rotation of each planet gear 90 causes rotation of its associated driver 98 and driven 74 magnetic structures, platform 40 and thus each substrate 42 about its associated platform axis 46. In this manner, engagement between each planet gear 90 and the sun gear 92, and thus the formation of metal particulates, occurs outside of the chamber 50. This substantially reduces the overall amount of contamination generated within the chamber 50 during the sputtering process. Further, the ability to form a film having a substantially reduced particle density is enhanced. In an alternate embodiment, only one of the magnetic structures, for example the driver magnetic structure, includes magnets. In this embodiment, the driven magnetic structure is fabricated from a magnetically attractive material which enables the formation of the magnetic coupling with the driver magnetic structure.

In a preferred embodiment, the chamber 50 includes a groove having a groove surface 104 which is separated from the inner wall surface 58 by a second wall thickness 106 which is less than the first wall thickness 60. Positioning of the driver north 100 and south 102 magnetic poles adjacent to the groove surface 104 enables closer placement between the driver north 100 and south 102 and driven south 78 and north 76 poles, respectively, thus increasing the strength of the magnetic coupling and the amount of torque which may be transmitted. In addition, the chamber 50 is fabricated from a non-magnetic material for reducing the amount of magnetic force dissipated through either the first 60 or second 106 wall thicknesses, such as aluminum alloy or type 304 stainless steel, in order to further increase the strength of the magnetic coupling.

In operation, the first motor 70 is activated to cause rotation of the drive shaft 14. Rotation of the drive shaft 14 causes a corresponding circular rotation of the lower spider structure 64, planet gear 90, lower shaft 88, driver 98 and driven 74 magnetic structures, upper shaft 80, upper spider structure 62, each platform 40 and thus each substrate 42 about its center axis 18. This circular rotation, in conjunction with the engagement between the sun gear 92 and each planet gear 90, also causes simultaneous rotation of each planet gear 90, lower shaft 88, driver 98 and driven 74 magnetic structures, upper shaft 80, each platform 40 and thus each substrate 42 about its associated platform axis 46. This forms a compound pattern of movement for each substrate 42 wherein each substrate 42 rotates about its associated platform axis 46 simultaneously with traveling in an arc shaped pattern when in the deposition zone 49. It is noted that the present invention may also be implemented in other devices having alternate drive mechanisms which provide other suitable patterns of movement for the substrate during the sputtering process.

The device 48 further includes a drive plate 108 which is affixed to the sun gear 92. The drive plate 108 includes a center hole 110 defined by an inner wall 112. The neck section 66 of the lower spider structure 64 is positioned within the center hole 110. A bearing assembly 114 is affixed between the neck section 66 and the inner wall 112. The bearing assembly 114 enables the sun gear 92 and the lower spider structure 64 to rotate relative to one another about the center axis 18. In addition, the device 48 includes a second gear set 116 and a second motor 118 which are adapted to rotate the drive plate 108 and thus the sun gear 92 about the center axis 18. In accordance with the present invention, activation of the second motor 118 causes a change in relative motion between the sun gear 92 and each planet gear 90. This enables the ratio of rotational speed for each substrate 42 about its associated platform axis 46, relative to the rotational speed of each substrate 42 about the center axis 18, to vary. Referring to FIGS. 3A–3B, the relative motion of the present invention will be described. In FIGS. 3A–3B, the sun gear 92, one arm element 82 and one planet gear 90 are illustratively depicted in a top view for purposes of clarity. Referring to FIG. 3A in conjunction with FIG. 2, a first operating condition wherein the first motor 70 is activated and the second motor 118 is not activated is shown. Activation of the first motor 70 causes rotation of the arm element 82 and thus planet gear 90 in a first direction about the center axis 18 (indicated by first arrow 120) at a first rotational speed. This causes a simultaneous rotation of the planet gear 90 in the first direction about its associated platform axis 46 (indicated by second arrow 122) at a second rotational speed due to engagement between the sun 92 and planet 90 gears. Since the second motor 118 is not activated, the sun gear 92 is stationary. As such, under the first operating condition (second motor 118 not activated), the ratio of the first rotational speed of the planet gear 90 about its associated platform axis 46 (second arrow 122), relative to the second rotational speed about the center axis 18 (first arrow 120), is constant. Therefore, the number of rotations of the planet gear 90 about its associated platform axis 46 for each rotation of the planet gear 90 about the center axis 18 is also constant.

Referring to FIG. 3B, a second operating condition wherein both the first 70 and second 118 motors are activated is shown. As previously described, activation of the first motor 70 causes the planet gear 90 to rotate in a first direction about the center axis 18 (first arrow 120) at a first rotational speed and about its associated platform axis 46 (second arrow 122) at a second rotational speed. In accordance with the present invention, the second motor 118 is activated to cause the sun gear 92 to rotate in the first direction about the center axis 18 (indicated by third arrow 124) at a third rotational speed. This causes a change in the relative motion between the sun gear 92 and the planet gear 90. As a result, the ratio between the first and second rotational speeds under the second operation condition is changed relative to the ratio under the first operating condition. This results in a corresponding change in the number of rotations of the planet gear 90 about its associated platform axis 46 for each rotation of the planet gear 90 about the center axis 18. In a preferred embodiment, the first 70 and second 118 motors may be variable speed motors, although it is noted that other types of motors may be used. This enables either the first or second rotational speeds to be varied as desired. Therefore, the number of rotations of the planet gear 90 about its associated platform axis 46 relative to each rotation of the planet gear 90 about the center axis 18 may be increased or decreased as desired. Such increases or decreases in the number of rotations of the planet gear 90 enable adjustments in the sputtering process to compensate for selected film non-uniformities. It is noted that the ratio between the first and second rotational speeds may be varied such that there is no rotation of the planet gear 90 about its associated platform axis 46. Alternately, the direction of rotation of the second motor 118 may be reversed so as to cause the planet gear 90 to rotate in a direction opposite to the first direction.

During the sputtering process, the chamber 50 is typically at ground potential. It is frequently desirable to modify the conditions under which the sputtering process takes place by placing an electrical bias on each substrate 42 and platform 40 which is different from the ground potential of the chamber 50. Each substrate 42 is typically manufactured from electrically insulating materials. It has been found that the application of a radio frequency voltage at a frequency of 13.56 MHZ is sufficient for penetrating the substrate materials in order to provide the desired electrical bias. Referring to FIG. 4, an alternate embodiment of the present invention is shown. FIG. 4 is an enlarged view of left side of FIG. 2. In this embodiment, the device 48 includes an electrical bias circuit 126 for providing a desired electrical bias on each substrate 42. The circuit 126 includes a first insulating element 128 which serves to affix the upper spider structure 62 to the drive shaft 14. The first insulating element 128 electrically isolates the drive shaft 14 from the upper spider structure 62. A contact shaft 130 is affixed to the upper spider structure 62. As such, the contact shaft 130 rotates in unison with the upper spider structure 62 as the upper spider structure 62 rotates. The contact shaft 130 extends from the upper spider structure 62 through the cavity 52 and out of the chamber 50. The chamber 50 further includes a second feedthrough element 132 which is isolated from the chamber 50 by a second insulating element 142. The second feedthrough element 132 serves to seal the contact shaft 130 and chamber 50 so as to maintain a vacuum level within the chamber 50 which is suitable for sputtering. The circuit 126 further includes a bias power supply 134 having a radio frequency supply and an impedance matching circuit (not shown). The bias power supply 134 is electrically connected to the contact shaft 130 by a contact element 136 which is adapted to maintain electrical contact with the contact shaft 130 as the contact shaft 130 rotates. Further, only a portion of the contact shaft 130 which is outside of the chamber 50 is contacted. As such, the formation of metal particulates resulting from contact between the contact element 136 and the contact shaft 130 occurs outside of the chamber 50, thus protecting each substrate 42 from contamination due to such particulates.

In accordance with the present invention, the upper spider structure 62 includes an outer section 138 which extends under each platform 40 and which is spaced relatively close to each platform 40 thus forming a gap 140. This forms an electrical capacitor wherein the outer section 138 forms a first electrode and each platform 40 forms a second electrode. In a preferred embodiment, the gap is approximately 0.05 inches and each platform 40 and a portion 142 of the outer section 138 adjacent to a platform 40 each have an area of approximately 65 square inches. This forms a capacitor having a capacitance of approximately 300 pico farads. It has been found that this is a sufficient value to enable the formation of a desired electrical bias on each substrate 42.

Thus, it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A device for rotating a substrate within a chamber having a wall for defining a cavity, comprising:

first rotating means for enabling rotation of said substrate about a first axis, wherein said first rotating means is located within said cavity;

second rotating means for enabling rotation of a planet gear about said first axis, wherein said second rotating means is located outside of said chamber;

magnet means for magnetically bonding said first and second rotating means through said wall to enable said first and second rotating means to rotate in unison about said first axis;

a sun gear adapted for engagement with said planet gear outside of said chamber;

first drive means for causing a first rotation of said first and second rotating means and thus said substrate about a center axis and for simultaneously causing a second rotation of said first and second rotating means and thus said substrate about said first axis due to said engagement between said planet gear and said sun gear.

2. The device according to claim 1, wherein said first and second rotating means each include two sets of magnets for forming said magnetic bond.

3. The device according to claim 1, wherein said chamber is maintained at a vacuum level suitable for sputtering and further including sealing means for sealing said chamber to maintain said vacuum level.

4. The device according to claim 1, wherein said first drive means includes a variable speed motor.

5. The device according to claim 1, wherein said chamber further includes a cathode for a sputtering process, said cathode having a source target for generating a deposition zone adjacent said target for forming a thin film on said substrate and wherein said substrate is rotated in said first and second rotations simultaneously when in said deposition zone during said sputtering process.

6. A device for rotating a substrate within a chamber having an outer wall surface and an inner wall surface for defining a cavity, comprising:

a first support element positioned within said cavity, said first support element including a first rotating structure affixed between a platform for supporting said substrate and a first magnet positioned adjacent said inner wall surface, wherein said first rotating structure is adapted to rotate about a first axis;

a second support element positioned outside of said chamber, said second support element including a second rotating structure affixed between a planet gear adapted for engagement with a sun gear and a second magnet positioned adjacent said outer wall surface and spaced apart from said first magnet for forming a magnetic bond between said first and second magnets, wherein said second rotating structure is adapted to rotate about said first axis thereby enabling said first and second rotating structures to rotate in unison about said first axis; and a drive element affixed to said first and second support elements, wherein rotation of said drive element causes a first rotation of said substrate about a center axis and simultaneously causes a second rotation of said substrate about said first axis due to said engagement between said sun gear and said planet gear.

7. The device according to claim 6, wherein said first and second rotating structures further include a third and fourth magnets, respectively, for forming said magnetic bond.

8. The device according to claim 6, wherein said chamber is maintained at a vacuum level suitable for sputtering and further including a sealing element for sealing said drive element and said chamber to main said vacuum level.

9. The device according to claim 6, further including a motor for rotating said drive element.

10. The device according to claim 6, wherein said chamber further includes a cathode for a sputtering process, said cathode having a source target for generating a deposition zone adjacent said target for forming a thin film on said substrate and wherein said substrate is rotated in said first and second rotations simultaneously when in said deposition zone during said sputtering process.

11. A device for rotating a substrate during a sputtering process, comprising:

a chamber having an outer wall surface and an inner wall surface for defining a cavity;

a first support element positioned within said cavity, said first support element including a first rotating structure affixed between a platform for supporting said substrate and a first magnet positioned adjacent said inner wall surface, wherein said first rotating structure is adapted to rotate about a first axis;

a second support element positioned outside of said chamber, said second support element including a second rotating structure affixed between a planet gear adapted for engagement with a sun gear and a second magnet positioned adjacent said outer wall surface and spaced apart from said first magnet for forming a magnetic bond between said first and second magnets, wherein said second rotating structure is adapted to rotate about said first axis thereby enabling said first and second rotating structures to rotate in unison about said first axis;

a drive element affixed to said first and second support elements;

a first motor element for rotating said drive element, wherein rotation of said drive element causes a first rotation of said substrate about a center axis at a first rotational speed and simultaneously causes a second rotation of said substrate about said first axis at a second rotational speed due to said engagement between said sun gear and said planet gear; and a second motor element for rotating said sun gear at a third rotational speed thereby changing relative motion between said sun gear and said planet gear for providing a variable ratio between the number of rotations of said planet gear for each rotation of said sun gear.

12. The device according to claim 11, wherein said first and second rotating structures further include a third and fourth magnets, respectively, for forming said magnetic bond.

13. The device according to claim 11, wherein said chamber is maintained at a vacuum level suitable for sputtering and further including a sealing element for sealing said drive element and said chamber to main said vacuum level.

14. The device according to claim 11, wherein said first and second motor elements include variable speed motors.

15. The device according to claim 11, wherein said outer wall surface includes a groove to enable closer placement of said second magnet to said first magnet for forming a stronger magnetic bond.

16. The device according to claim 11, wherein said chamber is fabricated from a non-magnetic material.

17. The device according to claim 11, wherein said chamber further includes a cathode for a sputtering process, said cathode having a source target for generating a deposition zone adjacent said target for forming a thin film on said substrate and wherein said substrate is rotated in said first and second rotations simultaneously when in said deposition zone during said sputtering process.

18. A method for moving a substrate in a pattern of movement within a cavity defined by a wall of a chamber, comprising the steps of:

providing a first support element for supporting said substrate and a first magnet within said cavity, wherein said first support element is movable within said cavity about a first axis;

providing a second support element for supporting a second magnet outside of said cavity, wherein said second support element is movable outside of said chamber about said first axis;

forming a magnetic bond through said wall between said first and second support elements to enable said first and second support elements to move in unison;

moving said second support element about said first axis; and moving said second support element about a center axis, thereby moving said substrate in said pattern in said cavity.

19. The method according to claim 18, wherein said chamber further includes a cathode for a sputtering process, said cathode having a source target for generating a deposition zone adjacent said target for forming a thin film on said substrate and wherein said substrate is moved in said pattern through said deposition zone during said sputtering process.

20. A device for rotating a substrate during a sputtering process, comprising:

a chamber having an outer wall surface and an inner wall surface for defining a cavity;

a first support element positioned within said cavity, said first support element including a first rotating structure affixed between a platform for supporting said substrate and a first magnet positioned adjacent said inner wall surface, wherein said first rotating structure is adapted to rotate about a first axis;

a second support element positioned outside of said chamber, said second support element including a second rotating structure affixed between a planet gear adapted for engagement with a sun gear and a second magnet positioned adjacent said outer wall surface and spaced apart from said first magnet for forming a magnetic bond between said first and second magnets, wherein said second rotating structure is adapted to rotate about said first axis thereby enabling said first and second rotating structures to rotate in unison about said first axis;

a drive element affixed to said first and second support elements;

a first motor element for rotating said drive element, wherein rotation of said drive element causes a first rotation of said substrate about a center axis at a first rotational speed and simultaneously causes a second rotation wherein said engagement between said sun gear and said planet gear causes said substrate to rotate about said first axis at a second rotational speed;

a second motor element for rotating said sun gear at a third rotational speed thereby changing relative motion between said sun gear and said planet gear for providing a variable ratio between the number of rotations of said planet gear for each rotation of said sun gear;

a first insulating element for insulating said drive element from said first support element;

a contact shaft affixed to said first support element and extending through said cavity and out of said chamber;

a bias power supply for applying a radio frequency voltage; and a contact element for electrically connecting said contact shaft to said bias power supply to form a bias circuit for forming a desired electrical bias on said substrate.

21. The device according to claim 20, wherein said first and second rotating structures further include a third and fourth magnets, respectively, for forming said magnetic bond.

22. The device according to claim 20, wherein said chamber is maintained at a vacuum level suitable for sputtering and further including a first sealing element for sealing said drive element and said chamber to maintain said vacuum level.

23. The device according to claim 20, wherein said first and second motor elements include variable speed motors.

24. The device according to claim 20, wherein said outer wall surface includes a groove to enable closer placement of said second magnet to said first magnet for forming a stronger magnetic bond.

25. The device according to claim 20, wherein said chamber is fabricated from a non-magnetic material.

26. The device according to claim 25, wherein said material includes aluminum alloy.

27. The device according to claim 25, wherein said material includes stainless steel.

28. The device according to claim 20, wherein a first section of said first support element and said platform are spaced apart to form a capacitor.

29. The device according to claim 20, wherein said chamber further includes a cathode for a sputtering process, said cathode having a source target for generating a deposition zone adjacent said target for forming a thin film on said substrate and wherein said substrate is rotated in said first and second rotations simultaneously when in said deposition zone during said sputtering process.

30. A device for rotating a substrate during a sputtering process, comprising:

a chamber fabricated from a non-magnetic material, said chamber having an inner wall surface for defining a cavity and an outer wall surface having a groove, said chamber further including a cathode for a sputtering process, said cathode having a source target for generating a deposition zone adjacent said target for forming a thin film on said substrate and wherein said cavity is maintained under a vacuum level suitable for a sputtering process;

a first support element positioned within said cavity, said first support element including a first rotating structure affixed between a platform for supporting said substrate and a first pair of magnets positioned adjacent said inner wall surface, wherein said first rotating structure is adapted to rotate about a first axis;

a second support element positioned outside of said chamber, said second support element including a second rotating structure affixed between a planet gear adapted for engagement with a sun gear and a second pair of magnets positioned within said groove and spaced apart from said first pair of magnets for forming a magnetic bond between said first and second pair of magnets, wherein said second rotating structure is adapted to rotate about said first axis thereby enabling said first and second rotating structures to rotate in unison about said first axis;

a drive element affixed to said first and second support elements;

a first variable speed motor element for rotating said drive element, wherein rotation of said drive element causes a first rotation of said substrate about a center axis at a first rotational speed and simultaneously causes a second rotation wherein said engagement between said sun gear and said planet gear causes said substrate to rotate about said first axis at a second rotational speed, and wherein said first and second rotations occur in said deposition zone during said sputtering process;

a second variable speed motor element for rotating said sun gear at a third rotational speed thereby changing relative motion between said sun gear and said planet gear for providing a variable ratio between the number of rotations of said planet gear for each rotation of said sun gear;

a first insulating element for insulating said drive element from said first support element;

a contact shaft affixed to said first support element and extending through said cavity and out of said chamber;

a bias power supply for applying a radio frequency voltage;

a contact element for electrically connecting said contact shaft to said bias power supply, wherein said platform and a first section of said first support element are spaced apart to form a capacitor for forming a bias circuit for generating a desired electrical bias on said substrate; and a sealing element for sealing said drive element and said chamber to maintain said vacuum level.

* * * * *